(12) United States Patent
Fuse

(10) Patent No.: US 8,871,637 B2
(45) Date of Patent: Oct. 28, 2014

(54) SEMICONDUCTOR STRUCTURE WITH INSULATED THROUGH SILICON VIA

(75) Inventor: Kenichi Fuse, Hadano (JP)

(73) Assignee: Empire Technology Development LLC, Wilmington, DE (US)

( * ) Notice: Subject to any disclaimer, the term of this patent is extended or adjusted under 35 U.S.C. 154(b) by 554 days.

(21) Appl. No.: 13/122,957

(22) PCT Filed: Nov. 2, 2010

(86) PCT No.: PCT/US2010/055071
§ 371 (c)(1),
(2), (4) Date: Apr. 6, 2011

(87) PCT Pub. No.: WO2012/060819
PCT Pub. Date: May 10, 2012

(65) Prior Publication Data
US 2012/0104611 A1    May 3, 2012

(51) Int. Cl.
*H01L 21/47* (2006.01)
*H01L 25/065* (2006.01)
*H01L 23/48* (2006.01)
*H01L 21/768* (2006.01)
*H01L 23/00* (2006.01)

(52) U.S. Cl.
CPC ...... *H01L 21/76898* (2013.01); *H01L 25/0657* (2013.01); *H01L 2224/0557* (2013.01); *H01L 23/481* (2013.01); *H01L 2224/06181* (2013.01); *H01L 2225/06541* (2013.01); *H01L 24/06* (2013.01); *H01L 2225/06513* (2013.01)
USPC .......................................... 438/629

(58) Field of Classification Search
USPC .......... 257/750, 766, 772, 758, 774; 438/627, 438/629
See application file for complete search history.

(56) References Cited

U.S. PATENT DOCUMENTS

| | | | |
|---|---|---|---|
| 4,704,368 A | 11/1987 | Goth et al. |
| 5,111,927 A | 5/1992 | Schulze, Jr. |
| 5,419,806 A | 5/1995 | Huebner |
| 6,287,940 B1 | 9/2001 | Cole et al. |
| 6,465,742 B1 | 10/2002 | Hiraoka et al. |
| 7,344,959 B1 | 3/2008 | Pogge et al. |

FOREIGN PATENT DOCUMENTS

JP          10-092802 A    4/1998
(Continued)

OTHER PUBLICATIONS http://www.istcorp.jp/div_cp_var_pyr.htm.
(Continued)

*Primary Examiner* — Nathan Ha
(74) *Attorney, Agent, or Firm* — Maschoff Brennan

(57) ABSTRACT

Techniques described herein generally relate to laminated semiconductor structures. In some examples, method of forming a polyimide film are described. An example method may include forming a through hole in a laminated semiconductor structure that includes multiple stacked semiconductor layers. An inner wall of the laminated semiconductor structure can define the through hole. The inner wall can be exposed to a solution including a salt of polyamic acid and/or a polyamic acid that can be precipitated on the inner wall. The precipitated polyamic acid on the inner wall can be transformed into a polyimide film substantially coating the inner wall.

24 Claims, 7 Drawing Sheets

(56) References Cited

FOREIGN PATENT DOCUMENTS

| | | |
|---|---|---|
| JP | 2003-289073 A | 10/2003 |
| JP | 2005-191255 A | 7/2005 |
| JP | 2006-134973 A | 5/2006 |
| JP | 2006-287211 A | 10/2006 |
| JP | 2008-066601 | 3/2008 |
| JP | 2010-010490 | 1/2010 |
| KR | 2002-0024495 | 3/2002 |
| WO | 2004/108595 A2 | 12/2004 |

OTHER PUBLICATIONS http://www.ube-ind.co.jp/japanese/products/fine/fine_01_04.htm.
http://www.dnp.co.jp/works/mems/tsv01.html.

International Search Report and Written Opinion for International Application No. PCT/US2010/055071 mailed on Feb. 7, 2011.

Yuan, J., et al., "A low-cost through via interconnection for ISM WLP," Microsystem Technologies, 2009, vol. 15, No. 8, pp. 1273-1277.

SEMICONDUCTOR STRUCTURE WITH INSULATED THROUGH SILICON VIA

BACKGROUND

Unless otherwise indicated herein, the materials described herein are not prior art to the claims in the present application and are not admitted to be prior art by inclusion in this section.

In semiconductor technologies, a three-dimensional integrated circuit is a single integrated circuit built by stacking silicon wafers and/or dies and interconnecting them vertically so that they behave as a single device. The present disclosure appreciates that by stacking the silicon wafers and interconnecting them vertically, various benefits can be realized with respect to the footprint, speed, and/or power of a three-dimensional integrated circuit as compared to conventional integrated circuits.

A through-silicon via ("TSV") is a conductive feature that passes vertically through the stacked wafers of the three-dimensional integrated circuit and can provide the vertical interconnection between stacked wafers. However, because the stacked wafers are formed from semiconductor materials that are conductive, the present disclosure appreciates that stacked wafers generally need to be insulated from the TSVs that pass though them.

SUMMARY

Techniques described herein generally relate to laminated semiconductor structures.

In some examples, methods of forming a polyimide film are described. An example method may include forming a through hole in a laminated semiconductor structure that includes multiple stacked semiconductor layers. An inner wall of the laminated semiconductor structure can define the through hole. The inner wall can be exposed to a solution including a salt of polyamic acid and/or a polyamic acid that can be precipitated on the inner wall. The precipitated polyamic acid on the inner wall can be transformed into a polyimide film substantially coating the inner wall.

In some examples, a laminated semiconductor structure is described that can include multiple stacked semiconductor layers with integrated circuits formed thereon. The stacked semiconductor layers can include a through hole that penetrates the stacked semiconductor layers. An electrical contact area can be located about a first portion of an inner wall of the laminated semiconductor structure that defines the through hole. A polyimide film can substantially coat the inner wall about a second portion of the inner wall, where the second portion is different from the first portion. A conductive element can fill a portion of the through hole and is in electrical contact with the electrical contact area of the inner wall. The conductive element can be electrically insulated from the second portion of the inner wall by the polyimide film.

In some examples, methods of forming a polyimide film are described that can include drilling through multiple stacked semiconductor layers of a laminated semiconductor structure to form a through hole. Each of the semiconductor layers can include one or more integrated circuits formed on one or both sides of each of the semiconductor layers. Electrical contact areas included on an inner wall of the laminated semiconductor structure that define the through hole can be masked. Over a predetermined time interval, the laminated semiconductor structure can be exposed to a solution including a salt of polyamic acid. During exposure of the laminated semiconductor structure to the solution, the solution is decomposed using an electric current such that polyamic acid is precipitated out of the solution onto unmasked areas of the inner wall to form a precipitated structure. After completion of the predetermined time interval, exposure of the precipitated structure to the solution can be terminated. After terminating exposure of the precipitated structure to the solution, the precipitated structure can be heated and dehydrated to alter the precipitated polyamic acid on the unmasked areas of the inner wall into a polyimide film substantially coating the unmasked areas of the inner wall. The mask can be removed to expose the electrical contact areas of the inner wall. A conductive element can be deposited within the through hole such that the conductive element can be electrically coupled to the electrical contact areas of the inner wall and can be electrically insulated from other portions of the inner wall by the polyimide film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

In the drawings:

FIG. 5A shows an example flow diagram of another method of forming a polyimide film in a through hole for an intra-layer interconnect of a semiconductor layer, all arranged in accordance with at least some embodiments described herein.

DETAILED DESCRIPTION

Figure 1:
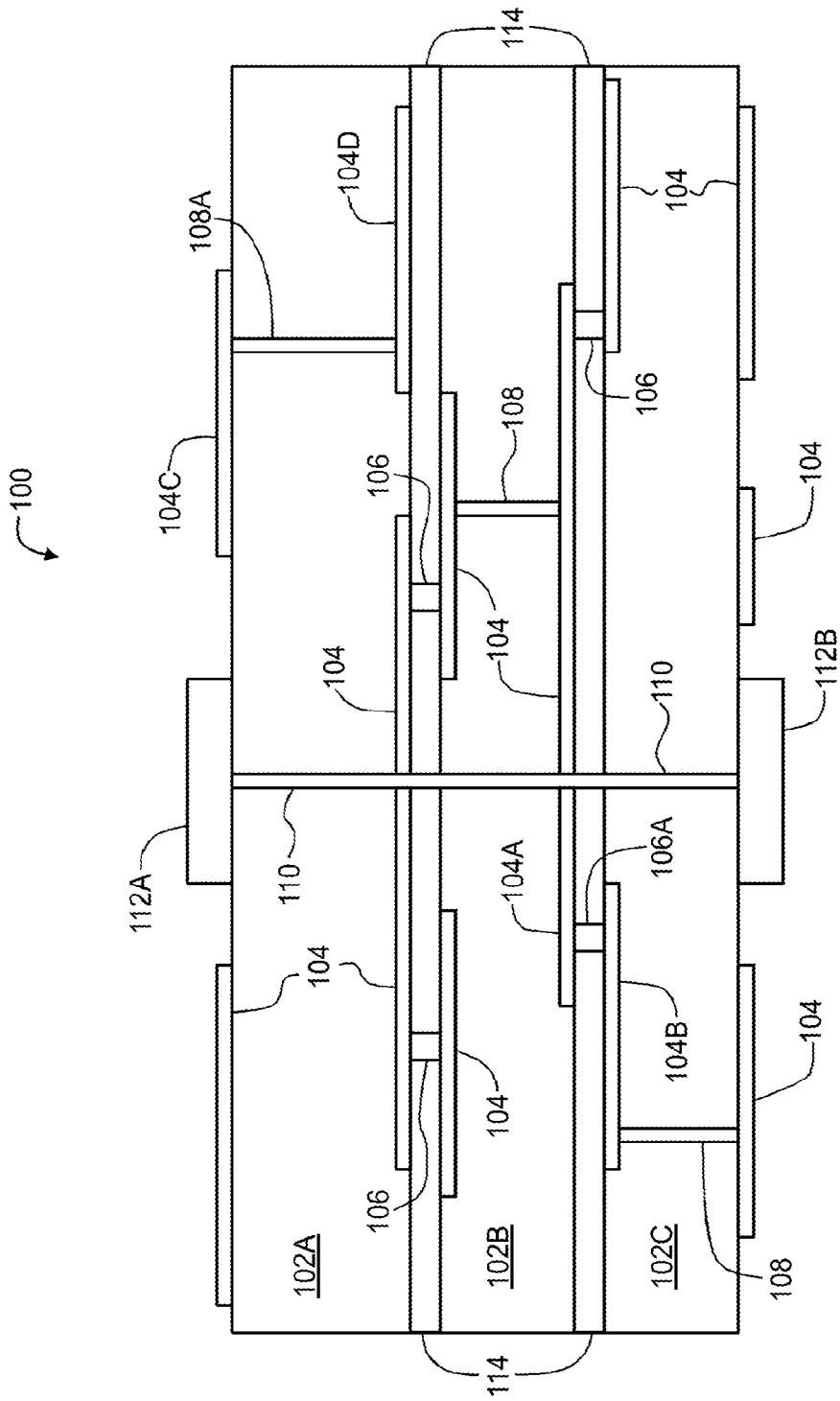
FIG. 1 is a cross-sectional view of an illustrative embodiment of a laminated semiconductor structure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Some embodiments disclosed herein relate generally to laminated semiconductor structures such as three-dimensional integrated circuits. Example embodiments may include laminated semiconductor structures with multiple stacked semiconductor layers. The laminated semiconductor structure can include a through hole that penetrates the semiconductor layers. An inner wall of the laminated semiconductor structure can define the through hole. An electrical contact area can be located about a first portion of the inner wall. A polyimide film can substantially coat the inner wall about a second portion of the inner wall that is different from the first portion. A conductive element can fill a portion of the through hole and can be arranged in electrical contact with the electrical contact area. The polyimide film can electrically insulate the conductive element from the second portion of the inner wall.

The polyimide film can be formed using a precursor of polyimide, such as polyamic acid. For example, a through hole may be formed in a laminated semiconductor structure that includes multiple stacked semiconductor layers, where an inner wall of the laminated semiconductor structure defines the through hole. The inner wall can be exposed to a solution including a salt of polyamic acid. Polyamic acid is precipitated on the inner wall by, for example, electrolysis. The precipitated polyamic acid on the inner wall can then be transformed into a polyimide film substantially coating the inner wall by, for instance, heating and/or dehydrating the laminated semiconductor structure including the precipitated polyamic acid.

FIG. 1 shows an illustrative example of a cross-sectional view of a laminated semiconductor structure 100 that is arranged in accordance with at least some embodiments described herein. The laminated semiconductor structure 100 can be a three-dimensional integrated circuit in some embodiments. In some examples, the laminated semiconductor structure may be any appropriate type of circuit including but not limited to a processor, a multi-core processor, a controller, a programmable logic device (PLD), a memory device, a system on a chip ("SOC"), or an application specific integrated circuit (ASIC).

The laminated semiconductor structure 100 can include multiple semiconductor layers 102A, 102B, 102C (collectively "semiconductor layers 102"). Semiconductor layers 102 can generally be formed from semiconductor wafers or individual dies cut from semiconductor wafers and may include doped or un-doped silicon or other suitable semiconductor material(s). Although three semiconductor layers 102 are illustrated in FIG. 1, the embodiments disclosed herein more generally include laminated semiconductor structures 100 having two or more semiconductor layers 102.

Each semiconductor layer 102 can include one or more electrical circuits 104, including electrical circuits 104A-104D, formed on one or more sides of the respective semiconductor layer 102. In the illustrated embodiment of FIG. 1, each semiconductor layer 102 can include electrical circuits 104 formed on two opposing sides of the respective semiconductor layer 102, although in other embodiments one or more of the semiconductor layers 102 includes electrical circuits 104 formed on a single side of the respective semiconductor layer 102. The electrical circuits 104 can be electrically coupled by one or more of surface interconnects 106, intra-layer interconnects 108, and through-silicon via ("TSV") 110.

Surface interconnects 106 can include surface interconnect 106A. Surface interconnects 106 can be configured to electrically couple electrical circuits 104 on adjacent semiconductor layers 102. For example, surface interconnect 106A is configured to electrically couple electrical circuit 104A on semiconductor layer 102B and electrical circuit 104B on semiconductor layer 102C. Surface interconnects 106 can be formed, for example, from a conductive metal material such as gold, a metal alloy materials such as solder, a semiconductor material such as polycrystalline silicon, or any other suitable material(s).

Intra-layer interconnects 108 can include intra-layer interconnect 108A. Intra-layer interconnects 108 can be configured to electrically couple electrical circuits 104 on opposing sides of the same semiconductor layer 102. For instance, intra-layer interconnect 108A electrically couples electrical circuits 104C and 104D on opposing sides of semiconductor layer 102A. Intra-layer interconnects 108 can be formed from copper, tin, silver or other suitable material(s). Although the semiconductor layers 102 of FIG. 1 each include a single intra-layer interconnect 108, in other embodiments, a given semiconductor layer 102 may include as few as zero intra-layer interconnects 108 or as many as two or more intra-layer interconnects 108.

TSV 110 can be configured to electrically couple the semiconductor layers 102. In the illustrated embodiment, TSV 110 can be configured to penetrate the semiconductor layers 102 of laminated semiconductor structure 100. One end of TSV 110 can be coupled to an upper bond pad 112A and the other end of TSV 110 is coupled to a lower bond pad 112B. Although a single TSV 110 is illustrated in the laminated semiconductor structure 100 of FIG. 1, in other embodiments the laminated semiconductor structure 100 can include two or more TSVs 110. Additional details regarding the TSV 110 are disclosed below.

Insulating layers 114 can be provided between adjacent semiconductor layers 102 to electrically insulate the adjacent semiconductor layers 102 from each other. The insulating layers 114 can include silicon dioxide ("SiO$_2$"), titanium nitride ("TiN") or other suitable material(s).

Figure 2:
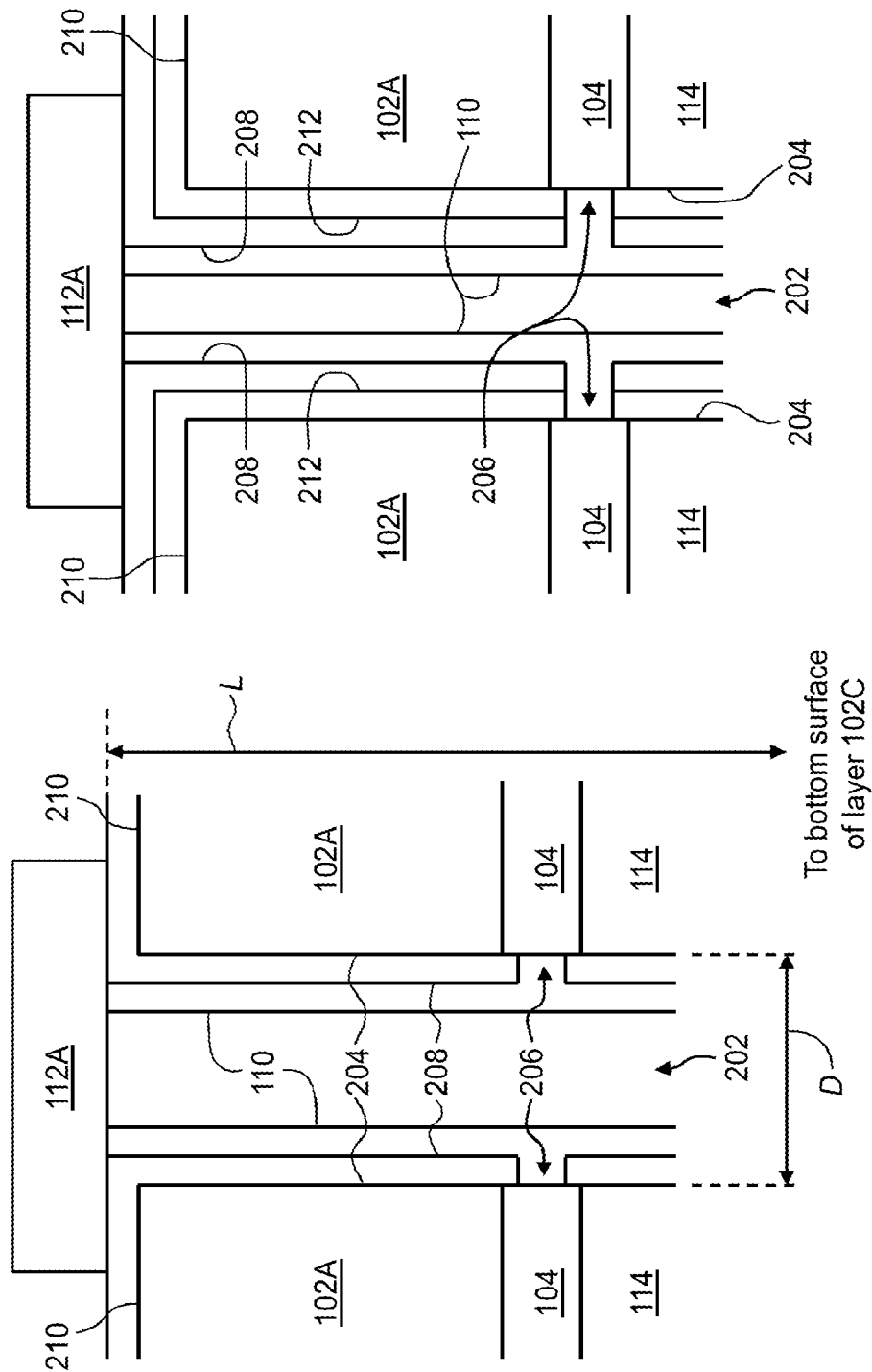
FIG. 2A is a detail cross-sectional view of an illustrative embodiment of a portion of the laminated semiconductor structure of FIG. 1.
FIG. 2B is a detail cross-sectional view of another illustrative embodiment of a portion of the laminated semiconductor structure of FIG. 1.

FIG. 2A shows an illustrative example of a detailed cross-sectional view of a portion of the laminated semiconductor structure 100 of FIG. 1, arranged in accordance with at least some embodiments described herein. The laminated semiconductor structure 100 can include a through hole 202 defined by an inner wall 204 of the laminated semiconductor structure 100. The through hole 202 can be configured to penetrate semiconductor layer 102A. Although not shown in FIG. 2A, the through hole 202 can additionally penetrate semiconductor layers 102B and 102C.

Through hole 202 may have a diameter D of about 50 micrometers ("μm") and a length L of about 100 μm. In other embodiments, the diameter of the through hole 202 may be more or less than 50 μm and the length of through hole 202 is more or less than 100 μm. The ratio D/L is referred to herein as the aspect ratio of the through hole 202.

In the illustrated embodiment, the TSV 110 can be electrically coupled to one or more electrical contact areas 206 located about a first portion of the inner wall 204. The electrical contact areas 206 can include electrical connections to, for instance, electrical circuits 104 of the semiconductor layer 102A. Accordingly, the TSV 110 can be coupled to electrical circuits 104 within a semiconductor layer 102 through electrical contact areas 206.

Because the semiconductor layers 102 are generally formed from semiconductor materials, they may be electrically conductive. Accordingly, a polyimide film 208 may be provided to insulate the TSV 110 from the semiconductor layers 102. In particular, the polyimide film 208 substantially coats the inner wall 204 about a second portion of the inner wall 204 that is different from the first portion corresponding to electrical contact areas 206.

Polyimide film 208 may have a thickness of several micrometers (μm). In some embodiments, the thickness of polyimide film 208 may be less than about 10 μm. In other embodiments, the thickness of polyimide film 208 may range from about 5 μm to about 10 μm, or from about 7 μm to about 9 μm.

Alternately or additionally, polyimide film 208 may have an electric permittivity of several farads per meter ("F/m"). In some embodiments, the electric permittivity of polyimide film 208 may be less than about 3.55 F/m. In other embodiments, the electric permittivity of polyimide film 208 may range from about 3.0 to about 3.55 F/m, or from about 3.15 to about 3.4 F/m.

Alternately or additionally, polyimide film 208 may have a dissipation factor less than about 0.0035. In other embodiments, the dissipation factor of polyimide film 208 may range from about 0.0015 to about 0.0035. In other embodiments, the dissipation factor of polyimide film 208 is about 0.0025.

The TSV 110 can be formed inside the through hole 202 after formation of the polyimide film 208. In the illustrated example of FIG. 2A, the TSV 110 fills a portion of the through hole 202 that initially remains empty after formation of the polyimide film 208. In particular, the TSV 110 may be copper plating or other conductive plating that at least partially fills the through hole 202. More generally, the TSV 110 can be a conductive element that completely or partially fills a portion of the through hole 202. Examples of materials that can be used to form TSV 110 include, but are not limited to, copper, copper alloys, aluminum, silver, gold, nickel, tin, semiconductor materials such as poly-silicon, conductive polymers, or other suitable conductive material(s).

Optionally, the polyimide film 208 can be additionally configured to coat at least a portion of an upper surface 210 of the semiconductor layer 102A to insulate the upper bond pad 112A and the semiconductor layer 102A from each other. Although not shown, the polyimide film 208 may additionally be adapted to coat at least a portion of a lower surface of the semiconductor layer 102C to insulate the lower bond pad 112B and the semiconductor layer 102C from each other.

FIG. 2B shows an illustrative example of a detail cross-sectional view of a portion of the laminated semiconductor structure 100 of FIG. 1, arranged in accordance with at least some embodiments described herein. The embodiment of FIG. 2B is generally analogous to the embodiment of FIG. 2A, and like reference numbers designate like elements.

In contrast to FIG. 2A, the embodiment of FIG. 2B includes an insulating film 212 formed on the inner wall 204 between the polyimide film 208 and the inner wall 204. The insulating film 212 can include, for example, $SiO_2$, titanium nitride TiN or other suitable material(s).

Additionally, in the illustrated example of FIG. 2B, one or both of the insulating film 212 or polyimide film 208 can be arranged to coat at least a portion of the upper surface 210 of the semiconductor layer 102A and/or a lower surface of the semiconductor layer 102C to insulate the semiconductor layers 102A, 102C from the upper and lower bond pads 112A, 112B.

Although not shown, intra-layer interconnects 108 may be configured in a manner analogous to that shown in FIGS. 2A and 2B. For example, each intra-layer interconnect 108 may include copper plating or other suitable conductive element adapted to at least partially fill a through hole that penetrates a single semiconductor layer 102, the intra-layer interconnect 108 being formed on a polyimide film, where the polyimide film is formed on an inner wall of the single semiconductor layer 102, the inner wall defining the through hole.

Figure 3:
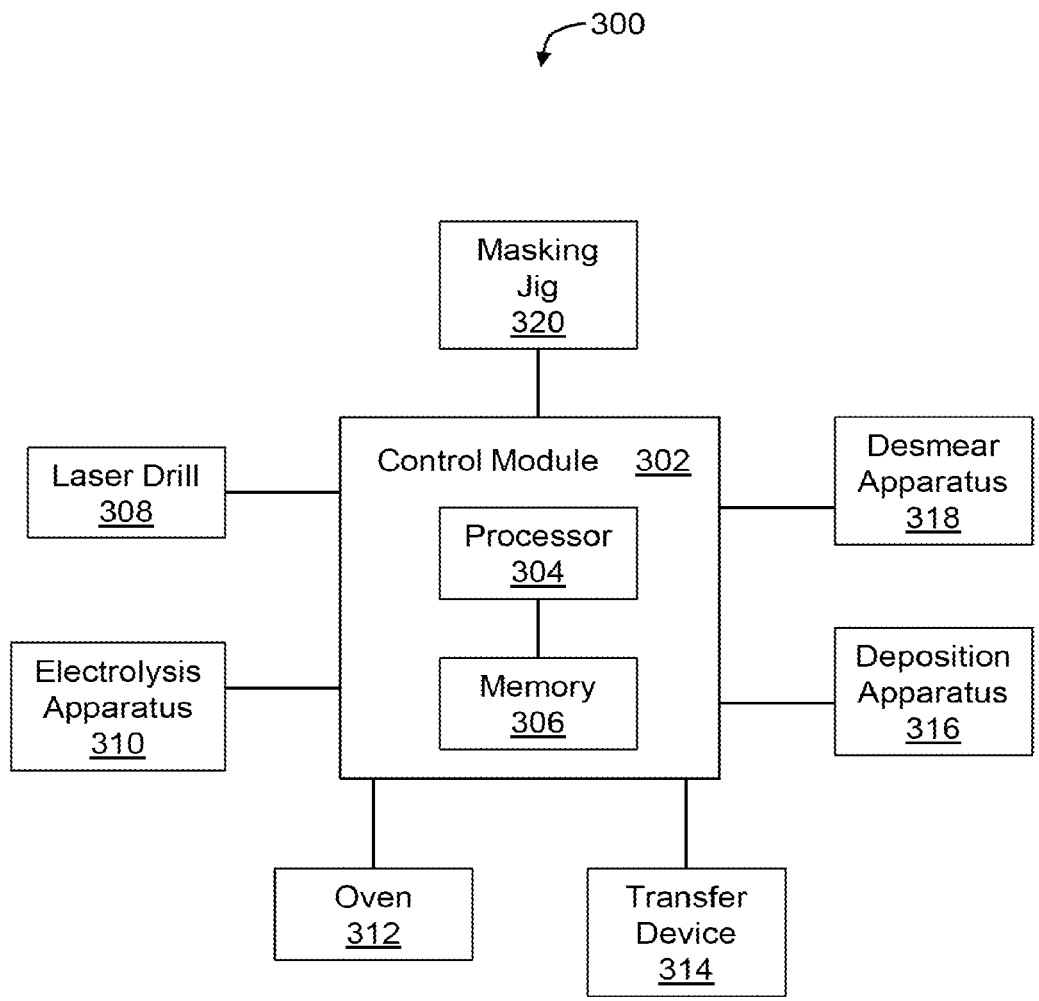
FIG. 3 is a block diagram of an illustrative embodiment of a system for forming a polyimide film.

FIG. 3 shows an illustrative example of a system 300 for forming a polyimide film in a through hole for a TSV or intra-layer interconnect of a laminated semiconductor structure, arranged in accordance with at least some embodiments described herein. FIG. 3 illustrates that some or all of the components for forming a polyimide film can be controlled automatically. A control module 302 may use a processor 304 to execute computer-executable instructions stored in a memory 306. Although FIG. 3 illustrates the processor 304 and memory 306 as being included within control module 302, in other embodiments the processor 304 and memory 306 can be provided remotely from the control module 302. The control module 302 can be coupled to one or more of a laser drill 308, an electrolysis apparatus 310, an oven 312 and one or more transfer devices 314. The control module 302 may be further coupled to one or more deposition apparatuses 316, a desmear apparatus 318 and a masking jig 320.

The control module 302 may be configured to control one or more of components 308, 310, 312, 314, 316, 318, 320 to perform one or more of the operations, functions or actions set forth below in an automated manner.

The laser drill 308 may be configured to form through holes in a laminated semiconductor structure. For instance, the laser drill 308 may be configured to drill through the laminated semiconductor structure. The laser drill 308 can include, by way of example and not limitation, a Q-switched Nd:YAG laser, a flash-lamp pumped Nd:YAG laser, an excimer laser, or other suitable laser.

In other embodiments, an etching tool, such as a plasma etcher, is provided for forming through holes in the laminated semiconductor structure. An etching tool may form the through holes by implementing a dry etching method such as deep reactive-ion etching ("DRIE"), or other suitable etching method.

The electrolysis apparatus 310 can be configured to expose the laminated semiconductor structure to a solution including a salt of polyamic acid, to decompose the solution using an electric current so as to precipitate polyamic acid on an inner wall defining a through hole in the laminated semiconductor structure. The electrolysis apparatus 310 may include a bath within which the laminated semiconductor structure can be immersed in the solution to expose the laminated semiconductor structure to the solution.

The electrolysis apparatus 310 can also be coupled to a current source and include leads, at least one of which can be coupled to the laminated semiconductor structure immersed in the solution so that the laminated semiconductor structure functions as an electrode when the solution is decomposed by passing current through the solution. The decomposition of the solution can result in the precipitation of polyamic acid on the inner wall of the laminated semiconductor structure.

Optionally, the electrolysis apparatus 310 can additionally include a sensor for measuring a thickness of the precipitated polyamic acid on the inner wall of the laminated semiconductor structure. Upon measuring a predetermined thickness of the precipitated polyamic acid, the electrolysis apparatus 310 may be configured to terminate exposure of the laminated semiconductor structure to the solution by, e.g., draining the solution from the bath or removing the laminated semiconductor structure from the bath.

Alternately or additionally, the electrolysis apparatus 310 can also include a timer configured to count down a predetermined time interval. Upon expiration of the time interval, the electrolysis apparatus 310 may be configured to terminate exposure of the laminated semiconductor structure as already explained above.

The oven 312 may be configured to transform or alter the precipitated polyamic acid on the inner wall of the laminated semiconductor structure into a polyimide film. For instance, the oven 312 may be configured to heat and dehydrate the laminated semiconductor structure to cause the precipitated polyamic acid to be transformed into polyimide.

The transfer device 314 can include an arm, conveyor belt, or other suitable device for transferring items from one location or apparatus to another. In particular, the transfer device 314 can be configured to transfer laminated semiconductor structures to/from one or more of the laser drill 308, electrolysis apparatus 310, oven 312, deposition apparatus 316, desmear apparatus 318, and masking jig 320.

The deposition apparatus 316 can be configured to deposit an insulating film on the inner wall of the laminated semiconductor structure prior to exposing the laminated semiconductor structure to the solution. Alternately or additionally, the deposition apparatus 316 can be configured to form a conductive element on the polyimide film inside the through hole. The deposition apparatus 316 may implement one or more of chemical vapor deposition, physical vapor deposition, sputtering, molecular beam epitaxy, or other suitable deposition technique. Although a single deposition apparatus 316 is depicted in FIG. 3, the system 300 may include multiple deposition apparatuses 316 that implement the same or different deposition techniques.

The desmear apparatus 318 can be configured to remove desmears from the inner wall of the laminated semiconductor structure. Desmears may be formed when the through hole in the laminated semiconductor structure is formed by laser drilling, for example. The desmear apparatus 318 can include a plasma desmear apparatus that removes desmears by flowing plasma through the through hole, a wet blasting apparatus that removes desmears by flowing liquid and abrasive grains through the through hole, or other suitable apparatus.

The masking jig 320 can be configured to mask electrical contact areas included on the inner wall of the laminated semiconductor structure to avoid formation of polyimide on the electrical contact areas. For instance, the masking jig 320 can be configured to apply a mask material to the electrical contact areas prior to formation of the polyimide film on the inner wall. The mask material can include lost wax, or other suitable masking material(s).

Figure 4A:
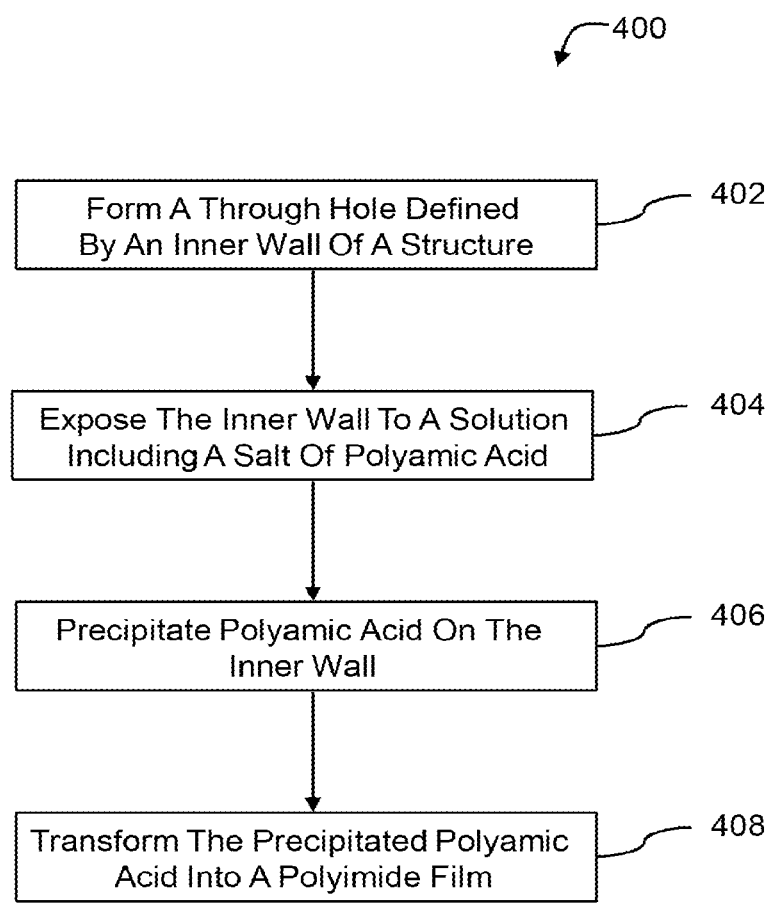
FIG. 4A shows an example flow diagram of a method of forming a polyimide film in a through hole of a laminated semiconductor structure.

FIG. 4A shows an illustrative example of a method 400 of forming a polyimide film in a through hole for a TSV of a laminated semiconductor structure, arranged in accordance with at least some embodiments described herein. Method 400 includes various operations, functions, or actions as illustrated by one or more of blocks 402, 404, 406 and/or 408. Method 400 may begin at block 402.

In block 402, ["Form a Through Hole Defined by an Inner Wall of a Structure"], a through hole can be formed in a laminated semiconductor structure that includes multiple stacked semiconductor layers. The through hole can be defined by an inner wall of the laminated semiconductor structure. The through hole may be formed by a laser drill, such as the laser drill 308 of FIG. 3, or an etching tool, or other suitable device that implements any appropriate method or process such as laser drilling, DRIE, or the like. In some embodiments, each semiconductor layer has one or more integrated circuits formed thereon. Block 402 may be followed by block 404.

In block 404, ["Expose the Inner Wall to a Solution Including a Salt of Polyamic Acid"], the inner wall can be exposed to a solution including a salt of polyamic acid. Exposing the inner wall to the solution may include immersing the laminated semiconductor structure in the solution. For example, the solution may be provided in a bath of an electrolysis apparatus, such as the electrolysis apparatus 310 of FIG. 3. The exposure of the inner wall to the solution can be controlled by, e.g., the control module 302, which may instruct the electrolysis apparatus 310 to terminate the exposure based on one or more signals received from a sensor or timer included in the electrolysis apparatus 310 or provided separate from the electrolysis apparatus.

In some embodiments, the salt of polyamic acid is a salt of an amine derivative. The amine derivative may be one or more of diethylamine, triethylamine, diphenylamine or trialkylamine. Alternately or additionally, a solvent used to form the solution includes one or more of a ketone type solvent such as methyl ethyl ketone ("MEK"), an ether type solvent such as Ethyl Cellosolve or Diisopropyl ether, an ester type solvent such as ethyl acetate, an organic halogen type solvent such as chloroform, other solvent such as N-methyl-2 pyrolidone ("NMP"), aromatic hydrocarbon, dimethyl sulfoxide ("DMSO"), dimethylformamide ("DMF"), or other suitable solvent.

According to some embodiments, a viscosity of the solution and aspect ratio of the through hole may determine how smoothly and completely the solution can flow into and fill the through hole during exposure to the solution. Higher solution viscosity and lower aspect ratio of the through hole generally result in more difficulty and longer amount of time for the solution to completely flow into and fill the through hole. Accordingly, a desired viscosity of the solution can be determined before exposure to the solution and/or obtained by appropriate selection of a solvent concentration. Block 404 may be followed by block 406.

In block 406, ["Precipitate Polyamic Acid on the Inner Wall"], polyamic acid can be precipitated on the inner wall of the laminated semiconductor structure. In some embodiments, precipitating polyamic acid on the inner wall can be accomplished by decomposing the solution using an electric current to alter the salt of polyamic acid into polyamic acid. For instance, the solution can be decomposed by an electrolysis apparatus, such as electrolysis apparatus 310 of FIG. 3. According to some embodiments, polyamic acid has a lower solubility in the solvent than the salt of polyamic acid such that decomposing the solution causes the polyamic acid to precipitate on the inner wall. In some examples, the laminated semiconductor structure functions as an electrode when the solution is decomposed using electric current. Block 406 may be followed by block 408.

In block 408, ["Transform the Precipitated Polyamic Acid Into a Polyimide Film"], the precipitated polyamic acid can be transformed into a polyimide film substantially coating the inner wall. In some examples, the precipitated polyamic acid is transformed into polyimide film in response to heating and dehydrating the laminated semiconductor structure including the precipitated polyamic acid in an oven, such as the oven 312 of FIG. 3.

One skilled in the art will appreciate that, for the processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, other functions and operations not shown in FIG. 4A or described above can be included in the method 400. As an example, the method 400 may further include depositing an insulating film on the inner wall prior to exposing the inner wall to the solution and subsequently forming the polyimide film. In these and other embodiments, the insulating film may include $SiO_2$, TiN, or other suitable material(s). The insulating film can be deposited on the inner wall by a deposition apparatus, such as the deposition apparatus 316 of FIG. 3.

As another example, the method 400 may further include removing desmears from the inner wall after forming the through hole in embodiments in which the through hole is formed by drilling with a laser. The desmears may be removed by a physical method such as plasma irradiation plus ultra-violet ("UV") irradiation (e.g., λ less than about 250 nanometers), a chemical method such as wet blasting, or some other suitable removal method. The desmears can be removed by a desmear apparatus, such as the desmear apparatus 318 of FIG. 3.

As yet another example, the method 400 may further include forming a conductive element on the polyimide film. In these and other embodiments, the polyimide film can substantially electrically insulate the conductive element from the semiconductor layers of the laminated semiconductor structure. Further, the conductive element can be a TSV in some embodiments. In some examples, the conductive element may include copper, copper alloys, aluminum, silver, gold, semiconductor materials such as poly-silicon, conductive polymers, or the like. The conductive element can be formed on the polyimide film by a deposition apparatus, such as the deposition apparatus 316 of FIG. 3.

As yet another example, the method 400 may further include masking electrical contact areas of the inner wall prior to exposing the inner wall to the solution to prevent precipitation of polyamic acid on the electrical contact areas. The electrical contact areas can be masked by a masking jig, such as the masking jig 320 of FIG. 3.

The method 400 may further include removing the masking from the inner wall prior to forming the conductive element on the polyimide film to permit the subsequently formed conductive element to directly contact the electrical contact areas of the inner wall that are exposed by removing the masking. In some embodiments, the masking material may include lost-wax, or other suitable material. The masking can be removed from the inner wall in some examples by inserting the laminated semiconductor structure in an oven, such as the oven 312 of FIG. 3, such that the masking material melts and flows out of the through hole.

As yet another example, the method 400 may further include forming upper and lower bond pads on the laminated semiconductor structure that are coupled to opposing ends of the conductive element formed on the polyimide film. The upper and lower bond pads can be formed by a deposition apparatus, such as the deposition apparatus 316 of FIG. 3.

While the method 400 of FIG. 4A has been discussed in the context of forming a polyimide film in a through hole for a TSV, the method 400 can be adapted to form a polyimide film in a through hole for an intra-layer interconnect. The formation of a polyimide film in a through hole for an intra-layer interconnect may be performed prior to the semiconductor layers of the laminated semiconductor structure being laminated together.

Figure 4B:
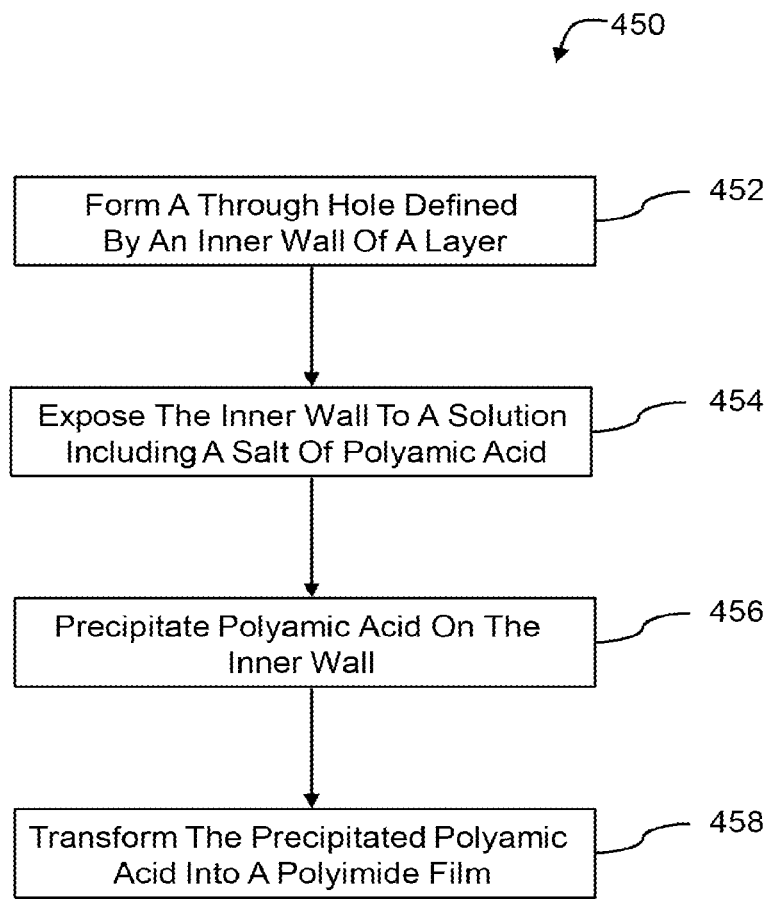
FIG. 4B shows an example flow diagram of a method of forming a polyimide film in a through hole for an intra-layer interconnect of a semiconductor layer.

For instance, FIG. 4B shows an illustrative example of a method 450 of forming a polyimide film in a through hole for an intra-layer interconnect, arranged in accordance with at least some embodiments described herein. Method 450 includes various operations, functions, or actions as illustrated by one or more of blocks 452, 454, 456 and/or 458. Method 450 may begin at block 452.

In block 452, ["Form A Through Hole Defined By An Inner Wall Of A Layer"], a through hole can be formed in a semiconductor layer. The through hole can be defined by an inner wall of the semiconductor layer. The through hole may be formed by a laser drill, such as the laser drill 308 of FIG. 3, or an etching tool, or other suitable device that implements any appropriate method or process such as laser drilling, DRIE, or the like. The semiconductor layer may be laminated together at a later time with one or more other semiconductor layers to form a laminated semiconductor structure in which polyimide film is formed in one or more through holes for corresponding TSVs as already described above. Block 452 can be followed by block 454.

In block 454, ["Expose the Inner Wall to a Solution Including a Salt of Polyamic Acid"], the inner wall of the semiconductor layer may be exposed to a solution including a salt of polyamic acid. Exposing the inner wall to the solution may include immersing the semiconductor layer in the solution. For example, the solution may be provided in a bath of an electrolysis apparatus, such as the electrolysis apparatus 310 of FIG. 3. The exposure of the inner wall to the solution can be controlled by, e.g., the control module 302, which may instruct the electrolysis apparatus 310 to terminate the exposure based on one or more signals received from a sensor or timer included in the electrolysis apparatus 310 or provided separate from the electrolysis apparatus.

In some embodiments, the salt of polyamic acid is a salt of an amine derivative. The amine derivative may be one or more of diethylamine, triethylamine, diphenylamine or trialkylamine. Alternately or additionally, a solvent used to form the solution includes one or more of methyl ethyl ketone ("MEK"), N-methyl-2 pyrolidone, aromatic hydrocarbon, Ethyl Cellosolve, Diisopropyl ether, ethyl acetate, chloroform, dimethyl sulfoxide ("DMSO"), or dimethylformamide ("DMF"). Block 454 can be followed by block 456.

In block 456, ["Precipitate Polyamic Acid on the Inner Wall"], polyamic acid can be precipitated on the inner wall of the semiconductor layer. In some embodiments, precipitating polyamic acid on the inner wall can be accomplished by decomposing the solution using an electric current to alter the salt of polyamic acid into polyamic acid. For instance, the solution can be decomposed by an electrolysis apparatus, such as electrolysis apparatus 310 of FIG. 3. According to some embodiments, polyamic acid has a lower solubility in the solvent than the salt of polyamic acid such that decomposing the solution causes the polyamic acid to precipitate on the inner wall. In some examples, the semiconductor layer functions as an electrode when the solution is decomposed using electric current. Block 456 can be followed by block 458.

In block 458, ["Transform the Precipitated Polyamic Acid Into a Polyimide Film"], the precipitated polyamic acid may be transformed into a polyimide film substantially coating the inner wall. In some examples, the precipitated polyamic acid is transformed into polyimide film in response to heating and/or dehydrating the semiconductor layer including the precipitated polyamic acid in an oven, such as the oven 312 of FIG. 3.

Figure 5A:
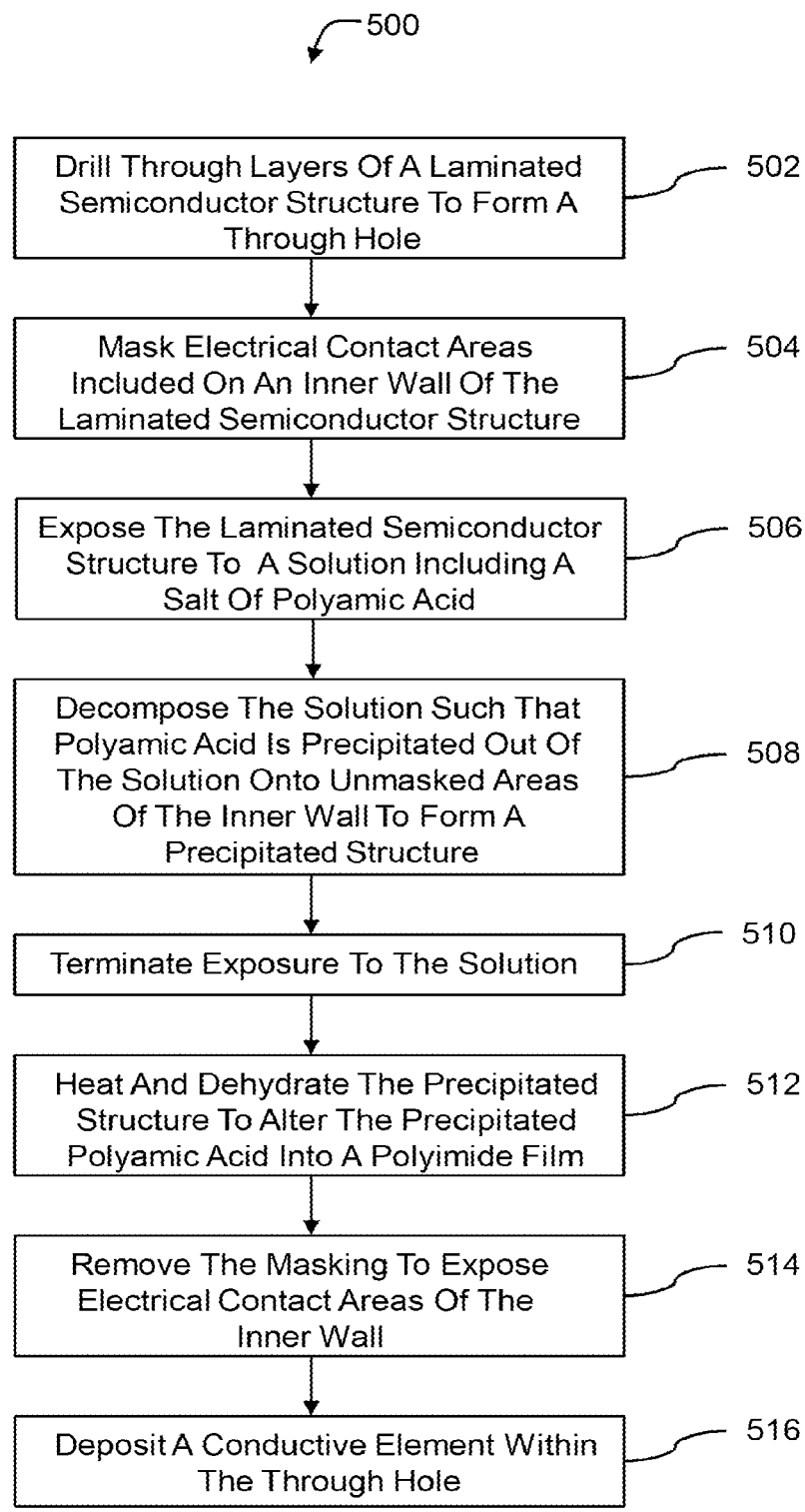
FIG. 5A shows an example flow diagram of another method of forming a polyimide film in a through hole of a laminated semiconductor structure.

FIG. 5A shows an illustrative example of another method 500 of forming a polyimide film in a through hole for a TSV of a laminated semiconductor structure, arranged in accordance with at least some embodiments described herein. Method 500 includes various operations, functions, or actions as illustrated by one or more of blocks 502, 504, 506, 508, 510, 512, 514, and/or 516. Method 500 may begin at block 502.

In block 502, ["Drill Through Layers of a Laminated Semiconductor Structure to Form a Through Hole"], a through hole can be formed by drilling through multiple semiconductor layers of a laminated semiconductor structure using a laser drill, such as the laser drill 308 of FIG. 3, or other suitable drilling device. In some embodiments, each semiconductor layer has one or more integrated circuits formed on one or both sides of the respective semiconductor layer. Block 502 can be followed by block 504.

In block 504, ["Mask Electrical Contact Areas Included on an Inner Wall of the Laminated Semiconductor Structure"], electrical contact areas included on an inner wall of the laminated semiconductor structure that define the through hole can be masked using a masking jig, such as the masking jig 320 of FIG. 3, or other suitable masking apparatus. The masking material may include lost-wax or other suitable material. Block 504 can be followed by block 506.

In block 506, ["Expose the Laminated Semiconductor Structure to a Solution Including a Salt of Polyamic Acid"], the laminated semiconductor structure can be exposed, over a predetermined time interval, to a solution including a salt of polyamic acid. Exposing the laminated semiconductor to the solution may include immersing the laminated semiconductor structure in the solution. For example, the solution may be provided in a bath of an electrolysis apparatus, such as the electrolysis apparatus 310 of FIG. 3.

In some embodiments, the salt of polyamic acid is a salt of an amine derivative. The amine derivative may be one or more of diethylamine, triethylamine, diphenylamine or trialkylamine. Alternately or additionally, a solvent used to form the solution includes one or more of a ketone type solvent such as methyl ethyl ketone ("MEK"), an ether type solvent such as Ethyl Cellosolve or Diisopropyl ether, an ester type solvent such as ethyl acetate, an organic halogen type solvent such as chloroform, other solvent such as N-methyl-2 pyrolidone ("NMP"), aromatic hydrocarbon, dimethyl sulfoxide ("DMSO"), or dimethylformamide ("DMF"), or other suitable solvent.

According to some embodiments, a viscosity of the solution and aspect ratio of the through hole may determine how smoothly and completely the solution can flow into and fill the through hole during exposure to the solution. Higher solution viscosity and lower aspect ratio of the through hole generally result in more difficulty and longer amount of time for the solution to completely flow into and fill the through hole. Accordingly, a desired viscosity of the solution can be determined before exposure to the solution and/or obtained by appropriate selection of a solvent concentration. In some embodiments, a control module, such as the control module 302 of FIG. 3, can calculate a desired viscosity and solvent concentration based on the aspect ratio of the through hole and/or other parameters. Optionally, the control module can control an electrolysis apparatus to prepare the solution with the selected solvent concentration. Block 506 can be followed by block 508.

In block 508, ["Decompose the Solution such that Polyamic Acid is Precipitated out of the Solution onto Unmasked Areas of the Inner Wall to Form a Precipitated Structure"], during exposure of the laminated semiconductor structure to the solution, the solution can be decomposed in an electrolysis apparatus, such as the electrolysis apparatus 310 of FIG. 3, using an electric current such that polyamic acid is precipitated out of the solution onto unmasked areas of the inner wall to form a precipitated wafer. In particular, in some embodiments, polyamic acid has a lower solubility in the solvent than the salt of polyamic acid such that decomposing the solution causes the polyamic acid to precipitate on the inner wall. In some examples, the laminated semiconductor structure functions as an electrode when the solution is decomposed using electric current. Block 508 can be followed by block 510.

In block 510, ["Terminate Exposure to the Solution"], after completion of the predetermined time interval, exposure of the precipitated structure to the solution can be terminated. In some embodiments, the length of the predetermined interval, and/or a length of an interval during which the solution is decomposed at block 508, is selected such that a thickness of the precipitated polyamic acid on the inner wall is a predetermined thickness. A timer included in an electrolysis apparatus or separately from the electrolysis apparatus can be used to countdown the predetermined interval or other interval. Alternately or additionally, a sensor included in an electrolysis apparatus or separately from the electrolysis apparatus can be used to monitor the thickness of the precipitated polyamic acid. Signals from one or both of the timer and sensor can be provided to a control module or directly to an electrolysis apparatus. In response to receiving a signal from the control module or directly from the electrolysis apparatus, the electrolysis apparatus may be configured to terminate exposure of the precipitated structure to the solution. Block 510 can be followed by block 512.

In block 512, ["Heat and Dehydrate the Precipitated Structure to Alter the Precipitated Polyamic Acid into a Polyimide Film"], after terminating exposure of the precipitated structure to the solution, the precipitated structure can be heated and/or dehydrated by an oven, such as the oven 312 of FIG. 3, to alter the precipitated polyamic acid on the unmasked areas of the inner wall into a polyimide film substantially coating the unmasked areas. Block 512 can be followed by block 514.

In block 514, ["Remove the Masking to Expose Electrical Contact Areas of the Inner Wall"], the masking can be removed to expose the electrical contact areas of the inner wall. In some embodiments, the masking can be removed by heating and dehydrating the precipitated structure in block 512 such that the masking material melts and flows out of the through hole. Block 514 can be followed by block 516.

In block 516, ["Deposit a Conductive Element within the Through Hole"], a conductive element can be deposited within the through hole such that the conductive element is electrically coupled to the electrical contact areas of the inner wall and is electrically insulated from other portions of the inner wall by the polyimide film. The conductive element can be deposited by a deposition apparatus, such as the deposition apparatus 316 of FIG. 3. The conductive element is a TSV in some embodiments. Alternately or additionally, the conductive element includes copper, copper alloys, aluminum, silver, gold, semiconductor materials such as poly-silicon, conductive polymers, or other suitable conductive material(s).

Other functions and operations not shown in FIG. 5A can be included in the method 500. As an example, the method 500 may further include depositing an insulating film on the inner wall prior to exposing the inner wall to the solution and subsequently forming the polyimide film. In these and other embodiments, the insulating film can include $SiO_2$, TiN, or other suitable material(s). The insulating film can be deposited using a deposition apparatus, such as the deposition apparatus 316 of FIG. 3.

As another example, the method 500 may further include removing desmears from the inner wall after forming the through hole in embodiments in which the through hole is formed by drilling with a laser. The desmears may be removed by a physical method such as plasma irradiation plus UV irradiation, or a method such as wet blasting. The desmears can be removed using a desmear apparatus, such as the desmear apparatus 318 of FIG. 3.

As yet another example, the method 500 may further include forming upper and lower bond pads on the laminated semiconductor structure that are coupled to opposing ends of the conductive element formed on the polyimide film. The upper and lower bond pads can be formed using a deposition apparatus, such as the deposition apparatus 316 of FIG. 3.

While the method 500 of FIG. 5A has been discussed in the context of forming a polyimide film in a through hole for a TSV, the method 500 can be adapted to form a polyimide film in a through hole for an intra-layer interconnect, as explained below with respect to FIG. 5B. The formation of a polyimide film in a through hole for an intra-layer interconnect may be performed prior to the semiconductor layers of the laminated semiconductor structure being laminated together.

Figure 5B:
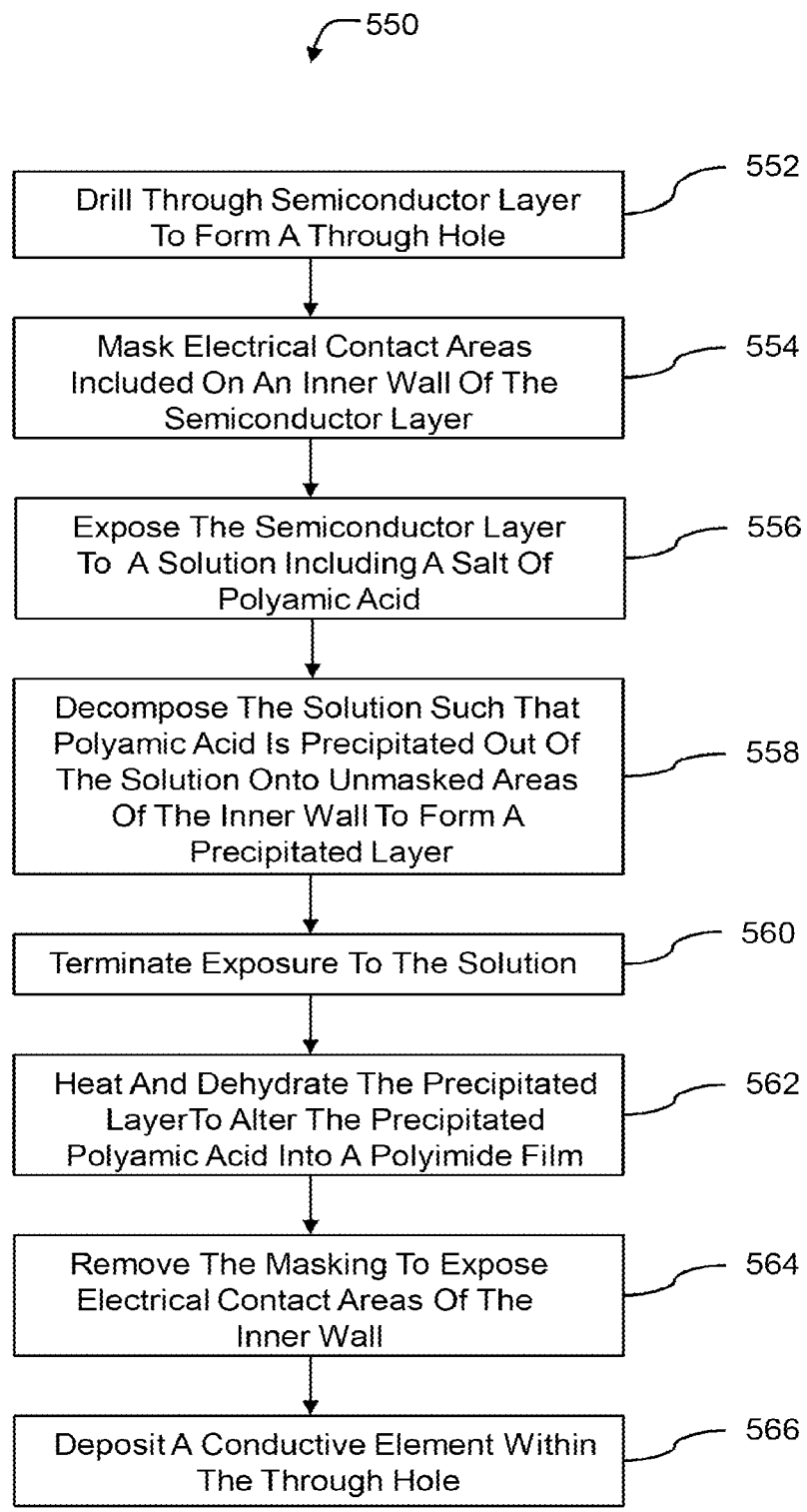

For instance, FIG. 5B shows an illustrative example of a method 550 of forming a polyimide film in a through hole for an intra-layer interconnect, arranged in accordance with at least some embodiments described herein. Method 550 includes various operations, functions, or actions as illustrated by one or more of blocks 552, 554, 556, 558, 560, 562, 564, and/or 566. Method 550 may begin at block 552.

In block 552, ["Drill Through Semiconductor Layer to Form a Through Hole"], a through hole can be formed by drilling through a semiconductor layer using a laser drill, such as the laser drill 308 of FIG. 3, or other suitable drilling device. The semiconductor layer may be laminated together at a later time with one or more other semiconductor layers to form a laminated semiconductor structure in which polyimide film is formed in one or more through holes for corresponding TSVs as already described above. Block 552 can be followed by block 554.

In block 554, ["Mask Electrical Contact Areas Included on an Inner Wall of the Semiconductor Layer"], electrical contact areas included on an inner wall of the semiconductor layer that define the through hole can be masked using a masking jig, such as the masking jig 320 of FIG. 3, or other suitable masking apparatus. The masking material may include lost-wax or other suitable material. Block 554 can be followed by block 556.

In block 556, ["Expose the Semiconductor Layer to a Solution Including a Salt of Polyamic Acid"], the semiconductor layer can be exposed, over a predetermined time interval, to a solution including a salt of polyamic acid. Exposing the semiconductor layer to the solution may include immersing the semiconductor layer in the solution. For example, the solution may be provided in a bath of an electrolysis apparatus, such as the electrolysis apparatus 310 of FIG. 3.

In some embodiments, the salt of polyamic acid is a salt of an amine derivative. The amine derivative may be one or more of diethylamine, triethylamine, diphenylamine or trialkylamine. Alternately or additionally, a solvent used to form the solution includes one or more of MEK, N-methyl-2 pyrolidone, aromatic hydrocarbon, Ethyl Cellosolve, Diisopropyl ether, ethyl acetate, chloroform, NMP, DMSO, or DMF.

According to some embodiments, a viscosity of the solution and aspect ratio of the through hole may determine how smoothly and completely the solution can flow into and fill the through hole during exposure to the solution. Higher solution viscosity and lower aspect ratio of the through hole generally result in more difficulty and longer amount of time for the solution to completely flow into and fill the through hole. Accordingly, a desired viscosity of the solution can be determined before exposure to the solution and/or obtained by appropriate selection of a solvent concentration. In some embodiments, a control module, such as the control module 302 of FIG. 3, can calculate a desired viscosity and solvent concentration based on the aspect ratio of the through hole and/or other parameters. Optionally, the control module can control an electrolysis apparatus to prepare the solution with the selected solvent concentration. Block 556 can be followed by block 558.

In block 558, ["Decompose the Solution such that Polyamic Acid is Precipitated out of the Solution onto Unmasked Areas of the Inner Wall to Form a Precipitated Layer"], during exposure of the semiconductor layer to the solution, the solution can be decomposed in an electrolysis apparatus, such as the electrolysis apparatus 310 of FIG. 3, using an electric current such that polyamic acid is precipitated out of the solution onto unmasked areas of the inner wall to form a precipitated layer. In particular, in some embodiments, polyamic acid has a lower solubility in the solvent than the salt of polyamic acid such that decomposing the solution causes the polyamic acid to precipitate on the inner wall. In some examples, the semi conductor layer functions as an electrode when the solution is decomposed using electric current. Block 558 can be followed by block 560.

In block 560, ["Terminate Exposure to the Solution"], after completion of the predetermined time interval, exposure of the precipitated layer to the solution can be terminated. In some embodiments, the length of the predetermined interval, and/or a length of an interval during which the solution is decomposed at block 558, is selected such that a thickness of the precipitated polyamic acid on the inner wall is a predetermined thickness. A timer included in an electrolysis apparatus or separately from the electrolysis apparatus can be used to countdown the predetermined interval or other interval. Alternately or additionally, a sensor included in an electrolysis apparatus or separately from the electrolysis apparatus can be used to monitor the thickness of the precipitated polyamic acid. Signals from one or both of the timer and sensor can be provided to a control module or directly to an electrolysis apparatus. In response to receiving a signal from the control module or directly from the electrolysis apparatus, the electrolysis apparatus may be configured to terminate exposure of the precipitated layer to the solution. Block 560 can be followed by block 562.

In block 562, ["Heat and Dehydrate the Precipitated Layer to Alter the Precipitated Polyamic Acid into a Polyimide Film"], after terminating exposure of the precipitated layer to the solution, the precipitated layer can be heated and/or dehydrated by an oven, such as the oven 312 of FIG. 3, to alter the precipitated polyamic acid on the unmasked areas of the inner wall into a polyimide film substantially coating the unmasked areas. Block 562 can be followed by block 564.

In block 564, ["Remove the Masking to Expose Electrical Contact Areas of the Inner Wall"], the masking can be removed to expose the electrical contact areas of the inner wall. In some embodiments, the masking can be removed by heating and dehydrating the precipitated layer in block 562 such that the masking material melts and flows out of the through hole. Block 564 can be followed by block 566.

In block 566, ["Deposit a Conductive Element within the Through Hole"], a conductive element can be deposited within the through hole such that the conductive element is electrically coupled to the electrical contact areas of the inner wall and is electrically insulated from other portions of the inner wall by the polyimide film. The conductive element can be deposited by a deposition apparatus, such as the deposition apparatus 316 of FIG. 3. The conductive element is a TSV in some embodiments. Alternately or additionally, the conductive element includes copper, copper alloys, aluminum, silver, gold, semiconductor materials such as poly-silicon, conductive polymers, or other suitable conductive material(s).

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub ranges and combinations of sub ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into sub ranges as discussed above. Finally, as will be understood by one skilled in the art, a range includes each individual member. Thus, for example, a group having 1-4 cells refers to groups having 1, 2, or 4 cells. Similarly, a group having 1-5 cells refers to groups having 1, 2, 4, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A method of forming a polyimide film in a through hole, the method comprising:
forming a through hole in a laminated semiconductor structure that includes multiple stacked semiconductor layers, wherein an inner wall of the laminated semiconductor structure defines the through hole and the through hole penetrates through the laminated semiconductor structure and through the multiple stacked semiconductor layers;
exposing the inner wall to a solution that includes a salt of polyamic acid;
precipitating polyamic acid on the inner wall; and
transforming the precipitated polyamic acid on the inner wall into a polyimide film that substantially coats the inner wall.

2. The method of claim 1, wherein the precipitated polyamic acid is transformed into a polyimide film in response to heating and dehydrating the laminated semiconductor structure that includes the precipitated polyamic acid.

3. The method of claim 1, further comprising forming a conductive element on the polyimide film, wherein the polyimide film substantially electrically insulates the conductive element from the multiple stacked semiconductor layers of the laminated semiconductor structure.

4. The method of claim 1, further comprising:
    masking electrical contact areas of the inner wall that are within the through hole with a mask prior to exposing the inner wall to the solution to prevent precipitation of polyamic acid on the electrical contact areas; and
    removing the mask within the through hole from the inner wall prior to forming the conductive element on the polyimide film to permit the subsequently formed conductive element to directly contact the electrical contact areas that are exposed by removing the mask.

5. The method of claim 1, wherein forming a through hole in the laminated semiconductor structure includes drilling through the multiple stacked semiconductor layers of the laminated semiconductor structure using a laser to form the inner wall that defines the through hole.

6. The method of claim 5, further comprising removing desmears from the inner wall.

7. The method of claim 1, further comprising:
    forming a second through hole that penetrates through a first semiconductor layer subsequently laminated together with one or more other semiconductor layers to form the laminated semiconductor structure, wherein an inner wall of the first semiconductor layer defines the second through hole;
    exposing the inner wall of the first semiconductor layer to a solution that includes a salt of polyamic acid;
    precipitating polyamic acid on the inner wall of the first semiconductor layer; and
    transforming the precipitated polyamic acid on the inner wall of the first semiconductor layer into a polyimide film that substantially coats the inner wall of the first semiconductor layer.

8. A method of forming a polyimide film in a through hole, the method comprising:
    forming a through hole in a laminated semiconductor structure that includes multiple stacked semiconductor layers, wherein an inner wall of the laminated semiconductor structure defines the through hole and the through hole penetrates through the laminated semiconductor structure and through the multiple stacked semiconductor layers;
    exposing the inner wall to a solution that includes a salt of polyamic acid;
    passing an electric current through the solution;
    decomposing the solution using the electric current;
    precipitating polyamic acid on the inner wall; and
    transforming the precipitated polyamic acid on the inner wall into a polyimide film that substantially coats the inner wall.

9. The method of claim 8, wherein the precipitated polyamic acid is transformed into a polyimide film in response to heating and dehydrating the laminated semiconductor structure that includes the precipitated polyamic acid.

10. The method of claim 8, further comprising forming a conductive element on the polyimide film, wherein the polyimide film substantially electrically insulates the conductive element from the multiple stacked semiconductor layers of the laminated semiconductor structure.

11. A method of forming a polyimide film in a through hole, the method comprising:
    forming a through hole in a laminated semiconductor structure that includes multiple stacked semiconductor layers, wherein an inner wall of the laminated semiconductor structure defines the through hole and the through hole penetrates through the laminated semiconductor structure and through the multiple stacked semiconductor layers;
    depositing an insulative film on the inner wall within the through hole;
    exposing the laminated semiconductor structure to a solution that includes a salt of polyamic acid after the insulative film is deposited on the inner wall;
    precipitating polyamic acid on the insulative film; and
    transforming the precipitated polyamic acid on the inner wall into a polyimide film that substantially coats the inner wall.

12. The method of claim 11, wherein the insulative film comprises silicon dioxide ($SiO_2$) or titanium nitride (TiN).

13. The method of claim 11, wherein the precipitated polyamic acid is transformed into a polyimide film in response to heating and dehydrating the laminated semiconductor structure that includes the precipitated polyamic acid.

14. The method of claim 11, further comprising, prior to precipitating polyamic acid on the inner wall, passing an electric current through the solution to decompose the solution.

15. A laminated semiconductor structure comprising:
    a plurality of stacked semiconductor layers with integrated circuits formed thereon, wherein the plurality of stacked semiconductor layers include a through hole that penetrates the plurality of stacked semiconductor layers;
    an electrical contact area located within the through hole about a first portion of an inner wall of the laminated semiconductor structure that defines the through hole;
    a polyimide film within the through hole that substantially coats the inner wall about a second portion of the inner wall, wherein the second portion is different from the first portion and the first and second portions are both located within the through hole; and
    a conductive element that fills a portion of the through hole and that is in electrical contact with the electrical contact area within the through hole and that is electrically insulated from the second portion of the inner wall by the polyimide film.

16. The laminated semiconductor structure of claim 15, wherein a thickness of the polyimide film is in a range from about 5 to about 10 micrometers.

17. The laminated semiconductor structure of claim 15, wherein an electric permittivity of the polyimide film is in a range from about 3.0 to about 3.55 farads per meter.

18. The laminated semiconductor structure of claim 15, wherein a dissipation factor of the polyimide film is about 0.0025%.

19. The laminated semiconductor structure of claim 15, wherein the plurality of stacked semiconductor layers include a first layer that includes a second through hole defined by an inner wall of the first layer, and wherein the laminated semiconductor structure further comprises:
    a first electrical contact area located about a first portion of the inner wall of the first layer and electrically coupled to an integrated circuit on a first side of the first layer;
    a second electrical contact area located about a second portion of the inner wall of the first layer and electrically coupled to an integrated circuit on a second side of the first layer;
    a polyimide film that substantially coats the inner wall of the first layer about a third portion of the inner wall of the first layer, wherein the third portion of the inner wall of the first layer is different from the first and second portions of the inner wall of the first layer; and
    a conductive element that fills a portion of the second through hole in electrical contact with the first and second electrical contact areas of the inner wall of the first layer.

20. A method of forming a polyimide film in a through hole of a stacked semiconductor structure, the method comprising:
- drilling through multiple stacked semiconductor layers of a laminated semiconductor structure to form a through hole, wherein each of the multiple stacked semiconductor layers includes one or more integrated circuits formed on one or both sides of each of the multiple stacked semiconductor layers;
- masking electrical contact areas included on an inner wall of the laminated semiconductor structure that defines the through hole with a mask, wherein the electrical contact areas are located within the through hole;
- exposing, over a predetermined time interval, the laminated semiconductor structure to a solution that comprises a salt of polyamic acid;
- during exposure of the laminated semiconductor structure to the solution, passing an electric current through the solution to decompose the solution such that polyamic acid is precipitated out of the solution onto unmasked areas of the inner wall that are within the through hole to form a precipitated structure;
- terminating, after completion of the predetermined time interval, exposure of the precipitated structure to the solution;
- after terminating exposure of the precipitated structure to the solution, heating and dehydrating the precipitated structure to alter the precipitated polyamic acid on the unmasked areas of the inner wall into a polyimide film that substantially coats the unmasked areas of the inner wall that are within the through hole;
- removing the mask from within the through hole to expose the electrical contact areas of the inner wall that are within the through hole; and
- depositing a conductive element within the through hole such that the conductive element is electrically coupled to the electrical contact areas of the inner wall within the through hole and is electrically insulated from other portions of the inner wall by the polyimide film.

21. The method of claim 20, wherein the salt of polyamic acid comprises a salt of an amine derivative.

22. The method of claim 21, wherein the amine derivative comprises one or more of diethylamine, triethylamine, diphenylamine, or trialkylamine.

23. The method of claim 20, wherein a solvent used to form the solution comprises one or more of methyl ethyl ketone, N-methyl-2 pyrolidone, aromatic hydrocarbon, Ethyl Cellosolve, Diisopropyl ether, ethyl acetate, chloroform, dimethyl sulfoxide, or dimethylformamide.

24. The method of claim 23, further comprising, prior to exposing the inner wall to the solution, selecting a solvent concentration based on a desired viscosity of the solution.

* * * * *

UNITED STATES PATENT AND TRADEMARK OFFICE
CERTIFICATE OF CORRECTION

| | | |
|---|---|---|
| PATENT NO. | : 8,871,637 B2 | Page 1 of 1 |
| APPLICATION NO. | : 13/122957 | |
| DATED | : October 28, 2014 | |
| INVENTOR(S) | : Fuse | |

It is certified that error appears in the above-identified patent and that said Letters Patent is hereby corrected as shown below:

In the Specification

In Column 7, Lines 15-16, delete "dcsmcar" and insert -- desmear --, therefor.

In Column 11, Line 32, delete "triethylaminc, diphenylaminc" and insert -- triethylamine, diphenylamine --, therefor.

Signed and Sealed this
Fourteenth Day of April, 2015

Michelle K. Lee
*Director of the United States Patent and Trademark Office*